(12) United States Patent
Chapman et al.

(10) Patent No.: US 11,592,592 B2
(45) Date of Patent: Feb. 28, 2023

(54) TRACKING SYSTEM FOR VISUAL EFFECT TRIGGERING USING INDUCED MAGNETIC FIELD AND PREDICTIVE ANALYSIS

(71) Applicant: DISNEY ENTERPRISES, INC., Burbank, CA (US)

(72) Inventors: Steven M. Chapman, Thousand Oaks, CA (US); Joseph Hager, Valencia, CA (US)

(73) Assignee: Disney Enterprises, Inc., Burbank, CA (US)

( * ) Notice: Subject to any disclaimer, the term of this patent is extended or adjusted under 35 U.S.C. 154(b) by 826 days.

(21) Appl. No.: 16/582,967

(22) Filed: Sep. 25, 2019

(65) Prior Publication Data

US 2021/0088688 A1 Mar. 25, 2021

(51) Int. Cl.
| | | |
|---|---|---|
| A63J 5/02 | (2006.01) | |
| G01V 3/08 | (2006.01) | |
| G01R 33/10 | (2006.01) | |
| G05B 13/04 | (2006.01) | |
| G06T 19/00 | (2011.01) | |
| G06F 1/16 | (2006.01) | |

(Continued)

(52) U.S. Cl.
CPC .............. *G01V 3/081* (2013.01); *G01R 33/10* (2013.01); *G05B 13/048* (2013.01); *G06T 19/006* (2013.01); *A63F 13/25* (2014.09); *A63F 2300/8082* (2013.01); *A63J 5/02* (2013.01); *H04N 5/222* (2013.01)

(58) Field of Classification Search
CPC .......... A63G 31/00; A63G 31/16; G01D 5/14; G06F 1/16; G02B 27/01; A63J 5/02

USPC ......................................... 472/60–61, 65, 66
See application file for complete search history.

(56) References Cited

U.S. PATENT DOCUMENTS 8,321,173 B2  11/2012  Wallance et al.
9,823,092 B2 *  11/2017  David ................... G01D 5/147
(Continued)

FOREIGN PATENT DOCUMENTS

DE     102013211290 A1   12/2014
WO    WO2012098551 A1    7/2012

OTHER PUBLICATIONS

"Motion Tracking: No Silver Bullet, but a Respectable Arsenal"; 2002; Authors: Greg Welch and Eric Foxlin; University of North Carolina at Chapel Hill; InterSense. https://www.eecs.yorku.ca/course_archive/2005-06/F/4471/readings/cga02_welch_tracking-2.pdf.

(Continued)

*Primary Examiner* — Kien T Nguyen
(74) *Attorney, Agent, or Firm* — Dorsey & Whitney LLP

(57) ABSTRACT

A system comprises active magnetic emitters positioned within an area, passive magnetic emitters configured to be moved within the area, a magnetic field detector configured to measure a strength and direction of a magnetic field within the area, and a processor in communication with the magnetic field detector. The passive magnetic emitters are configured to be integrated in, coupled to, or secured to at least one tracked object or tracked subject within the area. The processor is configured to evaluate at least one change in the measured strength and direction of the magnetic field end send a signal to a visual effect actuator or visual effects display to initiate a visual effect based on the at least one change. A method and computer program product relating to the system is also provided.

20 Claims, 5 Drawing Sheets

(51) Int. Cl.
 *A63F 13/25* (2014.01)
 *H04N 5/222* (2006.01)

(56) References Cited

U.S. PATENT DOCUMENTS

| | | |
|---|---|---|
| 10,151,606 B1 | 12/2018 | Memarzanjany et al. |
| 2017/0307891 A1 | 10/2017 | Bucknor et al. |
| 2018/0364067 A1 | 12/2018 | Burgess et al. |

OTHER PUBLICATIONS

"Tracking Position and Orientation of Magnetic Objects Using Magnetometer Networks"; 2015; Authors: Niklas Wahlström and Fredrik Gustafsson; Student Member, Fellow, IEEE https://www.diva-portal.org/smash/get/diva2:866121/FULLTEXT01.pdf.

"3-AXIS Magnetic Sensor Array System for Tracking Magnet's Position and Orientation"; Proceedings of the 6th World Congress on Intelligent Control and Automation; Jun. 21-23, 2006; Authors:Chao Hu, Max Q.-H. Meng, Mrinal Mandal and Xiaona Wang; Dept. of EE. & Automation, Ningbo University, Ningbo, China; Dept. of EE, The Chinese University of Hong Kong, Shatin, Hong Kong; Dept, of ECE, University of Alberta, Edmonton, Canada.

\* cited by examiner

TRACKING SYSTEM FOR VISUAL EFFECT TRIGGERING USING INDUCED MAGNETIC FIELD AND PREDICTIVE ANALYSIS

BACKGROUND

In today's technological environment, visual effects can provide entertainment. For example, physical effects, such as fireworks and explosions can be engaging aspects of live shows and recorded content. In other examples, virtual content can be rendered and displayed in real-time to provide desired visuals. As such, visual effects immerse viewers into a content creators world and deliver an exciting and engaging experience. However, triggering events should be timed carefully to dive the proper effect, such as in the case of a fast-paced action sequence. Various systems and methods have been tested for use in detecting trigger events, but due to flaws inherent in such systems, including unacceptable degrees of latency, delay, inaccuracy, and unreliability in certain settings, they are unsuitable for achieving the level of realism desired.

Embodiments described herein address these problems and others, individually and, collectively.

SUMMARY

In one aspect, a system is provided. The system may comprise one or more active magnetic emitters configured to be situated at predetermined positions within a predefined area, one or more passive magnetic emitters configured to be freely movable within the predefined area, a magnetic field detector configured to measure a strength and direction of a magnetic field within the predefined area, and a processor in communication with the magnetic field detector. The one or more passive magnetic emitters are configured to be integrated in, coupled to, or secured to at least one tracked object or tracked subject within the predefined area, and the processor is configured to evaluate at least one change in the measured strength and direction of the magnetic field and to send a signal to a visual effect actuator or visual effects display to initiate the visual effect based on the at least one evaluated change.

In another aspect, a method is provided. The method may comprise positioning one or more active magnetic emitters at predetermined positions within a predefined area and introducing one or more passive magnetic emitters into the predefined area. The one or more passive magnetic emitters may be freely movable within the predefined area and configured to be integrated in, coupled to, or secured to et least one tracked object or tracked subject within the predefined area. The method may further comprise obtaining one or more measured values relating to a strength and direction of a magnetic field within the predefined area, evaluating at least one change relating to the measured strength and direction of the magnetic field, and sending a signal to a visual effects device to initiate the visual effect based on at least one evaluated change in the magnetic field within the predefined area.

In yet another aspect, a computer program product comprises a non-transitory computer readable storage device having a computer readable program stored thereon. The computer readable program when executed on a computer causes the computer to obtain one or more measured values relating to a strength and direction of a magnetic field within a predefined area, evaluate at least one change in the measured strength and direction of the magnetic field, and send a signal to a visual effects device to initiate the visual effect based on the at least evaluated change. The predefined area comprises one or more active magnetic emitters positioned at predetermined locations within the predefined area, and the predefined area further comprises one or more passive magnetic emitters that are freely movable within the predefined area and are configured to be integrated in, coupled to, or secured to at least one tracked object or tracked subject within the predefined area.

BRIEF DESCRIPTION OF THE DRAWINGS

The above-mentioned features of the present disclosure will become more apparent with reference to the following description taken in conjunction with the accompanying drawings, wherein like reference numerals denote like elements and in which.

DETAILED DESCRIPTION

Figure 1:
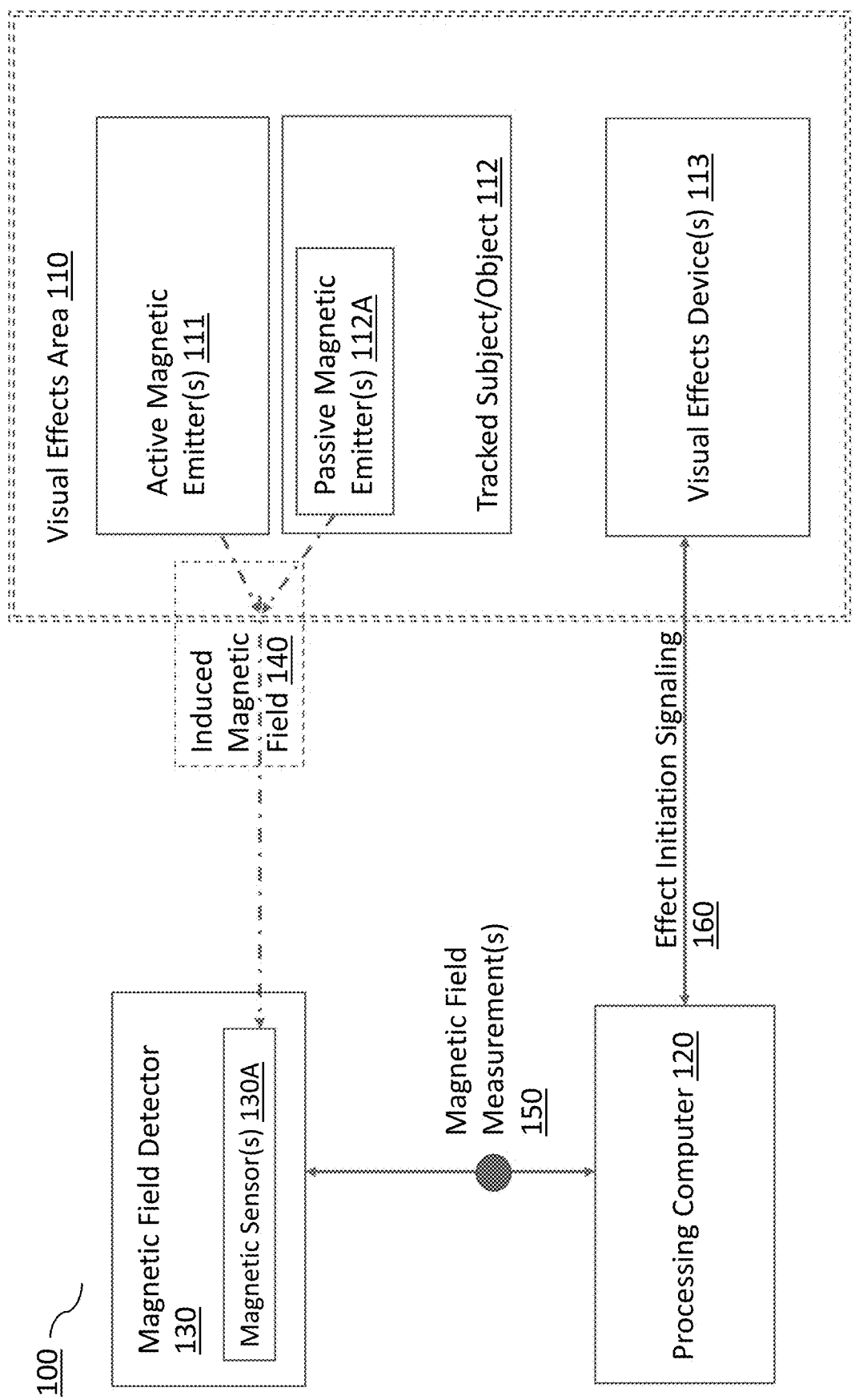
FIG. 1 illustrates a block diagram of a system for initiating visual effects according to embodiments.

A system is provided for initiating visual effects. The systems and methods described herein are well-suited for various visual effects settings, notably in film production and live entertainment. In such settings, special considerations must be made as to the types of tracking methods used. In prior systems, tracked subjects/objects required active magnetic elements (e.g., relying on powered emission and/or time multiplexing) to be fitted and attached directly thereon, whereas embodiments herein integrate a passive magnetic field-interactive component in the tracked subject/object, with active elements standing alone and offset in space from the tracked subjects/objects. Because the emitter/detector pair is standalone, embodiments allow for the computation of a three-dimensional volume map (heat map) of the induced magnetic field. Embodiments not only allow for computation of a strength vector but also for the ability to make differential comparisons of the neat map as it changes, thereby allowing a spatial motion function to be modeled. This may allow for the ability to perform predictive analysis and plan feedback to be triggered by the predicted state, and not merely the actual state. The benefit provided is that physical or virtual effects that require a ramp-up time for activation may be efficiently "spun-up" without user-detectible lag. As described herein, the terms "spun-up" and "ramp up" may refer to initial actions required for a visual effect to be executed. For example, for a visual effect actuator that relies on a mechanical, electromechanical, chemical, or other physical process to achieve a visual effect, the "spin-up time" or "ramp-up time" may be a period of time in which said process is occurring, and thus creates a delay between the time a command to initiate the visual effect is received and the time at which the visual effect is actually executed. For a visual effects display, the "ramp-up time" may be a period of time it may take the visual effects display to render and display visual graphics as the desired visual effect, which may be dependent on the computations required for rendering the visual graphics and/or the characteristics of the hardware used in performing said computations, such as the memory and processing power available to the visual effects display.

As one example, in a film-production set implementation relating to physical effects, a film-set camera operator may be shooting a wandering handheld shot following some action where a fire hydrant may explode with a fountain of water just as the camera's field of view passes over the hydrant. Using conventional approaches which operated without predictive information, the camera operator would need to stop his or her previous motion and focus on the hydrant as a direction is given to activate the water. Essentially, it would be clear to a sophisticated viewer that the camera operator knew the water was coming, and thus degrading the realism and immersion for the viewer. In contrast, embodiments herein may anticipate the camera's motion and may activate the physical effect (e.g., the explosion of water) in a timely manner that preserves realism in the shot.

In a separate implementation for a virtual game or virtual reality (VR) interaction, the effect desired may be one of a number of possible compute-intensive display effects. The display effects may require memory-hungry particle or physics computations that require startup time to load into memory and then "pre-heat" an initial condition based on the geometric and physics-engine state of the scene. If an effect were to interact with the geometric shape of three-dimensional objects in the current and upcoming frames of the scene, the predictive capability of systems herein may allow the software state to begin initialization and prepare for the predicted outcome. This may allow for a greater level of visual realism that may not be possible without the predictive information of the software state provided by embodiments of the invention.

Furthermore, conventional tracking systems rely on indirect simultaneous localization and mapping (SLAM), which may be doubly prone to error, once from the magnetic field error and then again from SLAM error. As such, the calculated position of a tracked subject/object may not correctly match the actual physical position of the tracked subject/object in a precise manner. Additionally, other systems that use magnetic tracking are prone to inaccuracy when tracking metallic objects that create magnetic interference. If the tracked device is a camera, prior systems required users to establish an offset of about a foot from the tracker to a camera body to achieve even moderate levels of accuracy. In systems and methods herein, instead of being inhibited by the magnetic interference of the camera's metal components, embodiments benefit from additional magnetic elements present in the tracking area.

FIG. 1 illustrates a block diagram of a system for initiating visual effects according embodiments. System 100 may comprise a visual effects area 110. Within or near the visual effects area 110, system 100 may further comprise one or more active magnetic emitter(s) 111, one or more tracked subject(s) or object(s) 112, and one or more visual effects deice(s) 113. Furthermore, the system 100 may further comprise one or more passive magnetic emitter(s) 112A that may be integrated in, coupled to, or secured to one or more tracked subjects/objects 112. For example, one or more passive magnetic emitter(s) 112A can be integrated or attached to various objects in a scene to track their movement and location. As another example, a tracked subject may be an individual player in a game, and one or more passive magnetic emitter(s) 112 may be integrated into wearable devices (e.g. headsets, vests, wristbands, gloves, shoes, etc.) so as to identify the player's pose during gameplay (as described in greater detail below).

The visual effects area 110 may be an area where objects and/or subjects can be tracked and/or visual effects may be initiated. For example, the visual effects area 110 may be a production set (e.g., a physical area for shooting/recording a scene for a movie or TV show), a live show set (e.g., a theme park attraction or stage show), or a gaming area (e.g,. a play area/simulation area for a hyperreality, mixed reality, augmented reality, and/or virtual reality game, or similar entertainment experience).

The tracked subject/object 112 may be any subject/object within the visual effects area 110 whose position, orientation, pose, and/or other characteristic movement or gesture may affect initiation of a desired visual effect. For example, on a movie set, the tracked subject/object 112 may be any one of a camera, camera equipment, lighting equipment (e.g., a spotlight, projector, or lighting fixture), prop, costume, actor/actress, vehicle, etc. As another example, on a live show set, the tracked subject/object 112 can also be a viewer of the live show. In yet another example, in a gaming area, the tracked subject/object may be a game controller, headset or other wearable device, play objects in the gaming area, or even the players themselves. In these examples and others, the position, pose, orientation of the tracked subject/objects, or component thereof may be tracked. For example, system 100 may track where viewers are looking or where a camera's viewing frustum is pointed. As described herein, pose may refer to a characteristic position or movement. As some non-limiting examples, a tracked subject may have a pose of "arms up and head to the side", "crouching and looking up", "pointing in the northwest direction", etc. The pose of a tracked subject may be determined using a plurality of trackable objects or devices worn by the tracked subject. For example, by tracking the position and orientation of a combination of headset(s) and hand controller(s) by a user, his or her pose may be determined.

The passive magnetic emitter(s) 112A may be magnetic elements that naturally produce a magnetic field without active power. For example, the passive magnetic emitter(s) 112A may comprise one or more permanent magnets (e.g., made from ferromagnetic or ferrimagnetic materials). In one embodiment, the passive magnetic emitter(s), may be a magnetic array or preconfigured arrangement of magnets, such as a Halbach arrangement of magnets (Halbach array) or other geometric configuration.

The visual effects device(s) 113 may be a device for executing a visual effect. In various implementations, the visual effects device(s) 113 may include visual effect actuators, visual effects displays, or combinations thereof. For example, the visual effects device(s) 113 may be any one of a lighting effects device, a display device, a pyrotechnics device, and/or an electromechanical device, in various embodiments. As such, a corresponding visual effect may be a lighting effect, a rendering of virtual content, a pyrotechnic effect (e.g., explosions, fireworks, flames, etc.), or some other controlled effect (e.g., activation of a machine, prop, sound emitting element, or other device) provided by the aforementioned visual effects device(s) 113.

Activation of the visual effects device(s) 113 and/or initiation of a corresponding visual effect, may be controlled/executed by the processing computer 120. The processing computer 120 may be, for example, processing computer 200 of FIG. 2 (described in greater detail further below in this description). According to embodiments, the processing computer 120 may initiate the corresponding visual effect based on one or more magnetic field measurement(s) 150 that are measured by a magnetic field detector 130 and communicated to the processing computer 120.

The magnetic field detector 130 may be a device for taking magnetic field measurements. In embodiments, the magnetic field detector 130 may be a magnetometer for measuring a direction, strength, and/or relative change of a magnetic field induced in the visual effects area 110 (i.e. induced magnetic field 140), such as a vector magnetometer or scalar magnetometer. For example, the magnetic field detector 130 may be any one of a proton magnetometer, Overhauser effect magnetometer, cesium vapor magnetometer, potassium vapor magnetometer, rotating coil magnetometer, hail effect magnetometer, fluxgate magnetometer, SQUID magnetometer, spin-exchange relaxation-free (SERF) magnetometer, and/or magneto-resistive device. In some embodiments, the magnetic field detector 130 may be stationary, or in other embodiments, may be configurable to move (e.g., translate and/or rotate).

The magnetic field detector 130 includes one or more magnetic sensor(s) 130A. In some embodiments, an induced magnetic field 140 present in the visual effects area 110 at various points in time may be sensed by the magnetic sensor(s) 130A of the magnetic field detector 130. The magnetic sensor(s) 130A may be an integrated circuit for detecting a magnetic field based on an evaluation of a physical effect, such as a change in voltage or resonant frequency (Lorentz Force) sensed electronically or a mechanical displacement sensed optically. For example, the magnetic sensor(s) 130A may comprise a microelectromechanical systems (MEMS) magnetic field sensor.

In some embodiments, magnetic field measurements(s) 150 measured by magnetic field detector 130 may be communicated to the processing computer 120. The processing computer 120 may be programmed to evaluate the magnetic field measurement(s) 150 and compare them against predefined visual effects initiation criteria. The predefined visual effects initiation criteria may comprise a desired or expected pose of the tracked subject/object 112 in the pre-established, predefined visual effects area 110. For example, the visual effects device(s) 113 may be an explosive device, which may be activated once a particular camera angle or desired pose for a shot has been achieved and that allows the camera operator to record a triggered explosion as it is happening. In another example, the visual effect may be a display of virtual content in a hyperreality game, and the visual effects initiation criteria may be a detected head pose of a user in the game where the head pose is such that the user's attention is directed at the intended location of where the virtual content should be placed in the gaming environment.

An effect initiation signal 160 may be sent by the processing computer 120 to the visual effects device(s) 113 to initiate the visual effect in within a predetermined amount of time once the processing computer 120 has determined that one or more visual effects initiation criteria has been met. For example, the effect initiation signal 160 may comprise a command to activate the visual effects device 113 and/or command the visual effects device 113 to begin the desired visual effect. The effect initiation signal 160 may be executed by a processor of processing computer 120 based on at least the magnetic field measurement(s) 150 received from the magnetic field detector 130. As previously mentioned, the effect initiation signal 160 may include an activation signal to activate or "ramp up" the visual effects device(s) 113. Furthermore, the effect initiation signal 160 may occur based on a predicted state of the induced magnetic field 140. According to embodiments, processing computer 120 may be configured to generate and update one or more heat maps of the induced magnetic field, which may be compared against a predictive model. For example, the magnitude and direction of the magnetic field can be mapped spatially. In one implementation, the one or more heat maps can be visually expressed in a manner similar to a temperature heat map, where the strength of a magnetic field may be expressed using a color scale (e.g. bluer hues representing lower magnitude areas, redder hues representing high magnitude areas). From the comparison, the processing computer 120 may predict a next update to the heat map(s), which may allow for the effect initiation signal 160 to be sent to the visual effects device 113 prior to a desired pose of the tracked pose of the tracked subject/object 112 being actually achieved. For example, a comparison of the heat map(s) to the predictive model may allow the processing computer 120 to determine the tracked subject/object 112's movement and predict that the tracked subject/object 112 will achieve the desired pose specified in the visual effects initiation criteria at the next time step or at least at a later time step for which a prediction can be made. Thus, system 100 may be used to track and predict pose, movement, orientation, and position of a tracked subject/object 112 so that a visual effect may be timely triggered.

Figure 2:
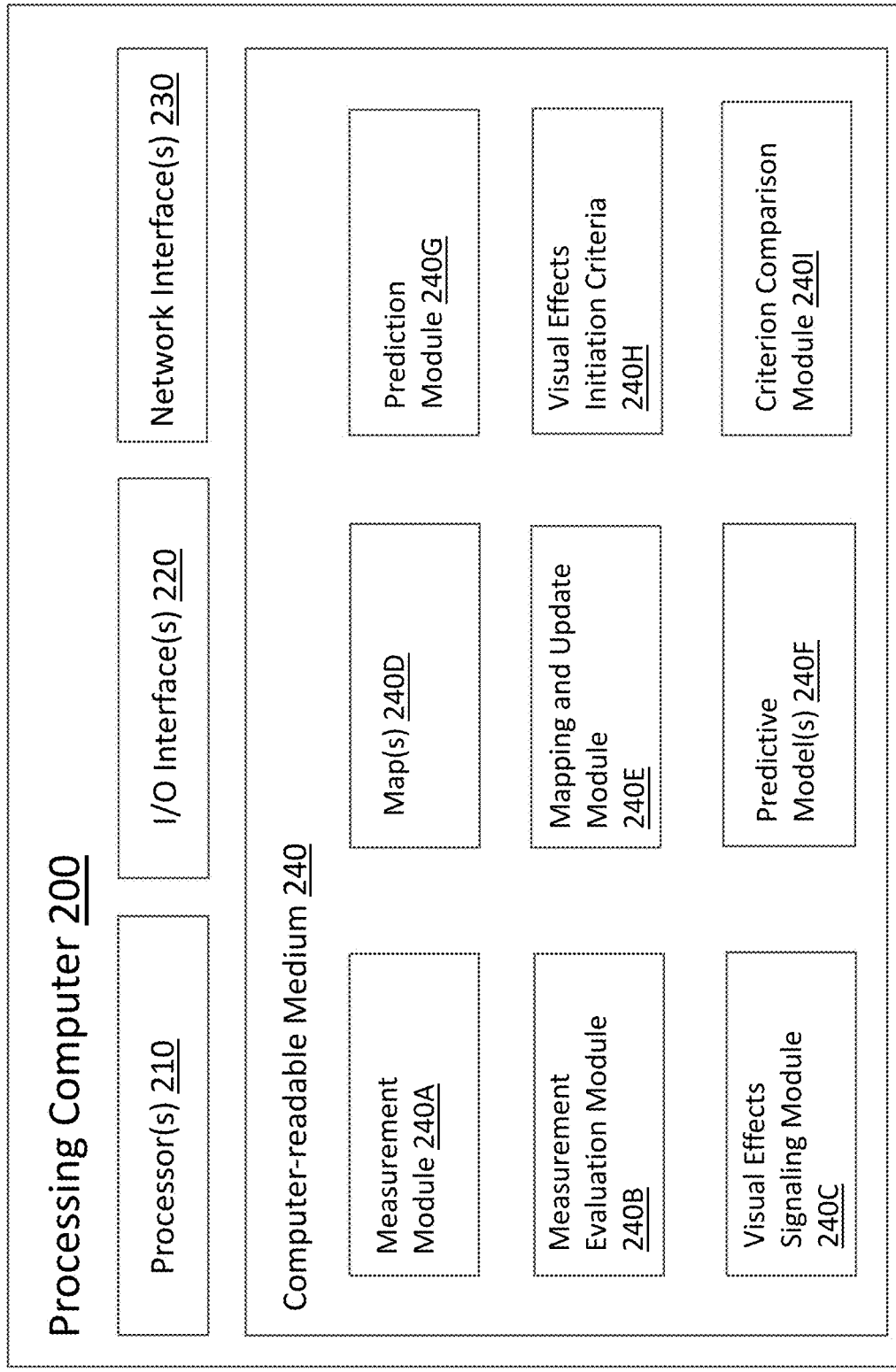
FIG. 2 illustrates a block diagram of a processing computer for tracking and predicting pose of subjects/objects according to embodiments.

FIG. 2 illustrates a block diagram of a processing computer for tracking and predicting pose of subjects/objects according to embodiments. Processing computer 200 may be a computer for performing processing functions relating to tracking and prediction of tracked subject/objects, evaluating visual effects initiation criteria, and signaling initiation of a visual effect, amongst other functions. The processing computer 200 may be, for example, processing computer 120 of FIG. 1, and may thus share the same or similar features and integration into system 100 of FIG. 1. Similarly, any mentioning of visual effects areas, tracked subjects/objects, active magnetic emitters, passive magnetic emitters, induced magnetic fields, visual effects devices, magnetic field detectors, magnetic sensors, magnetic field measurements, and/or effect initiation signaling used in describing FIG. 2 may apply to the corresponding elements in FIG. 1 and vice versa.

As shown in FIG. 2, the processing computer 200 may comprise one or more processor(s) 210, one or more I/O interface(s) 220, one or more network interface(s) 230, and at least one computer-readable medium 240. Processor(s) 210 may comprise one or more processors for performing calculations and executing computer-readable instructions. For example, processor(s) 210 may comprise one or more central processing units (CPUs) and/or one or more graphics processing units (GPUs). The I/O interface(s) 220 may comprise hardware for facilitating communication between one or more peripheral input/output devices and the processor(s) 210. For example, each of the I/O interface(s) 220 may include a communication bus and processing logic necessary for interpreting device addresses. The network interface(s) 230 may comprise one or more communication interfaces for communicating over a network. For example, the network interface(s) 230 may comprise a wired or wireless connection for transmitting, receiving, formatting, and reformatting messages over a standard communication protocol, such as over WiFi, Bluetooth near field Communication (NFC), RFID, USB, local area networks, cellular networks (e.g., 3G, 4G, 5G, LTE, etc.), global networks (e.g., the internet), etc. The computer-readable medium 240 comprise one or more non-transitory computer-readable mediums for storing instructions executable by the processor(s) 210. In embodiments, the instructions executable by the processor(s) 210 may be in the form of computer-readable code (i.e. computer code or program code). The computer-readable medium 240 may take the form of any number of internal or external memory devices, such as random-access memo (RAM), dynamic random-access memory (DRAM), static random-access memory (SRAM), flash memory, read-only memory (ROM), programmable read-only memory (PROM), erasable programmable read-only memory (EPROM), electrically erasable programmable read-only memory (EEPROM), to a few non-limiting examples. In certain embodiments, the processor-executable instructions may be stored in the computer-readable medium 240 as modules or portions of code. The modules may comprise measurement module 240A, measurement evaluation module 240B, visual effects signaling module 240C, mapping and update module 240E, prediction module 240G, and criterion comparison module 240I. Additionally computer-readable medium 240 may comprise sets of data or other stored information, such as map(s) 240D, predictive model(s) 240F, and visual effects initiation criteria 240H.

Measurement module 240A may comprise code for retrieving and/or taking measurements, notably magnetic field measurements received from a magnetic field detector. For example, measurement module 240A may comprise instructions for controlling a measurement function of the magnetic field detector and/or retrieving magnetic field measurements from the magnetic field detector at various points in time. Measurement evaluation module 240B may comprise code for evaluating one or more measurements, such as magnetic field measurements or one or more other values relating to a magnetic field within a predefined area (i.e. visual effects area). The one or more measurements or values relating to the magnetic field may directly or indirectly measure the complete magnetic field or may directly or indirectly measure vector components of the magnetic field. For example, the one or more measurements or values relating to the magnetic field may include a strength of the magnetic field, a direction of the magnetic field, a magnetic flux, or a combination thereof. Evaluating the one or more measurements may comprise evaluating at least one change in a magnetic field within the visual effects area 110. In one embodiment, evaluating the one or more measurements may comprise using magnetic field measurements to update a heat map of an induced magnetic field relative to a spatial mapping of the visual effects area 110 at various points in time (i.e. time steps). In embodiments, an update made to the heat map at a first time step may be used to predict a next update to the heat map for a subsequent time step, prior to new magnetic field measurements being obtained. As such, evaluating the one or more measurements may further comprise comparing the updated heat map to a predictive model and predicting a next update to the heat map for a second time step based on the comparison. The updating, comparing, and predicting steps may be initiated using code of the measurement evaluation module 240B and may be executed using code of mapping and update module 240E, prediction module 240G, and criterion comparison module 240I respectively. Visual effects signaling module 240C may comprise code for communicating signals for executing one or more visual effects. In embodiments, visual effects signaling module 240C may comprise instructions for sending a signal to a visual effects device to initiate a visual effect. This signal may be based on at least one evaluation made using instructions of the measurement evaluation module 240B, such as based on an updated heat map or based on a predicted next update.

Map(s) 240D may comprise one or maps relating to at least one predefined area, such as relating to visual effects area 110. In embodiments, the map(s) 240D may comprise a plurality of volumetric heat maps generated and updated based on magnetic field measurements. The plurality of volumetric heat maps may each represent magnetic field vectors (strength and direction) against a 3D spatial mapping of the predefined area. For example, the heat map may be a visual map in which spatial areas with greater magnetic field strength may be portrayed in a different color than lower magnetic field strength areas (e.g. red vs blue or darker vs lighter colors), and may further portray arrows for the direction in which the magnetic field appears to be moving in time. Furthermore, map(s) 240D may comprise the 3D spatial mapping of the predefined area.

Mapping and update module 240E may comprise code for obtaining, generating, and/or updating the map(s) 240D. In embodiments, updating the map(s) 240D may comprise updating a heat map at each time step (e.g., during the course of a live show, recorded production, or live gameplay taking place within the visual effects area). As previously mentioned, the heat map may be a map of a measured magnetic field relative to a spatial mapping of the visual effects area 110. Furthermore, mapping and update module 240E may comprise instructions for generating the map(s) 240D "on the fly", such as code for calculating and displaying the map(s) 240D at each time step based on sensor data obtained in real-time.

Predictive model(s) 240F may comprise one or more predictive model(s). In embodiments, the predictive model(s) may include at least one predictive model relating to the movement of tracked subjects/objects within a predefined area. This may include a model for predicting a next update to map(s) 240D based on data obtained at previous points in time (e.g. based on previous updates to map(s) 240D). For example, processing computer 200 may update a heat map of an induced magnetic field over the course of 5 different time steps, and the predictive model may comprise a function, trend, or, statistical distribution used to predict a subsequent update to the heat map based on the updates made at those previous 5 time steps. Thus, the predictive model may give a real-time prediction of pose, orientation, and motion of tracked subjects/objects, based on the modeled behavior of a magnetic field induced in the visual effects area. Prediction module 240G may comprise instructions for making predictions. This may include code for comparing an updated heat map to predictive model(s) 240F and to make a prediction as to a subsequent update to the heat map based on the comparison. For example, prediction module 240G may comprise instructions for applying magnetic field data to the predictive model(s) 240F and for calculating and interpolating future updates to the heat map. In other words, the prediction module 240G may comprise code for predicting movement of tracked subjects/objects in an induced magnetic field based on mapped trends and modeled behavior of the magnetic field.

Visual effects initiation criteria 240H may comprise criteria for initiating a visual effect. In embodiments, the visual effects initiation criteria may comprise a determined pose, position, orientation, and/or movement of a tracked subject/object present within a predefined area (e.g. within visual effects area 110). For example, one criterion may be a specified direction that a tracked subject should be facing prior to the effect, such as directly facing the portion of the visual effects area where the desired visual effect is localized. Criterion comparison module 240I may comprise code for comparing data to at least one criterion specified in visual effects initiation criteria 240H. For example, the data may include data about tracked subjects/objects in a visual effects area obtained in real-time. In embodiments, comparing the data to the at least one criterion may comprise comparing a predicted next update for a heat map of an induced magnetic field to the visual effects initiation criteria. This may comprise instructions for relating the magnetic field given by the heat map after the predicted next update to a mapped pose, position, orientation, and/or movement of magnetic emitters that correspond to tracked subjects/objects. For example, the criterion comparison module 240I may comprise code for determining that the induced magnetic field at the next time step will be indicative of a tracked subject turning towards the portion of the visual effects area where the visual effect will be localized once initiated. Thus, processing computer 120 may determine that a signal should be sent to initiate the visual effect in a timely manner, such as just before the desired pose of the tracked subject/object is achieved or at a point in time that accounts for the ramp-up time of the visual effects device (e.g. effect takes one second to ramp up, initiate one second before pose is predicted to occur).

Figure 3:
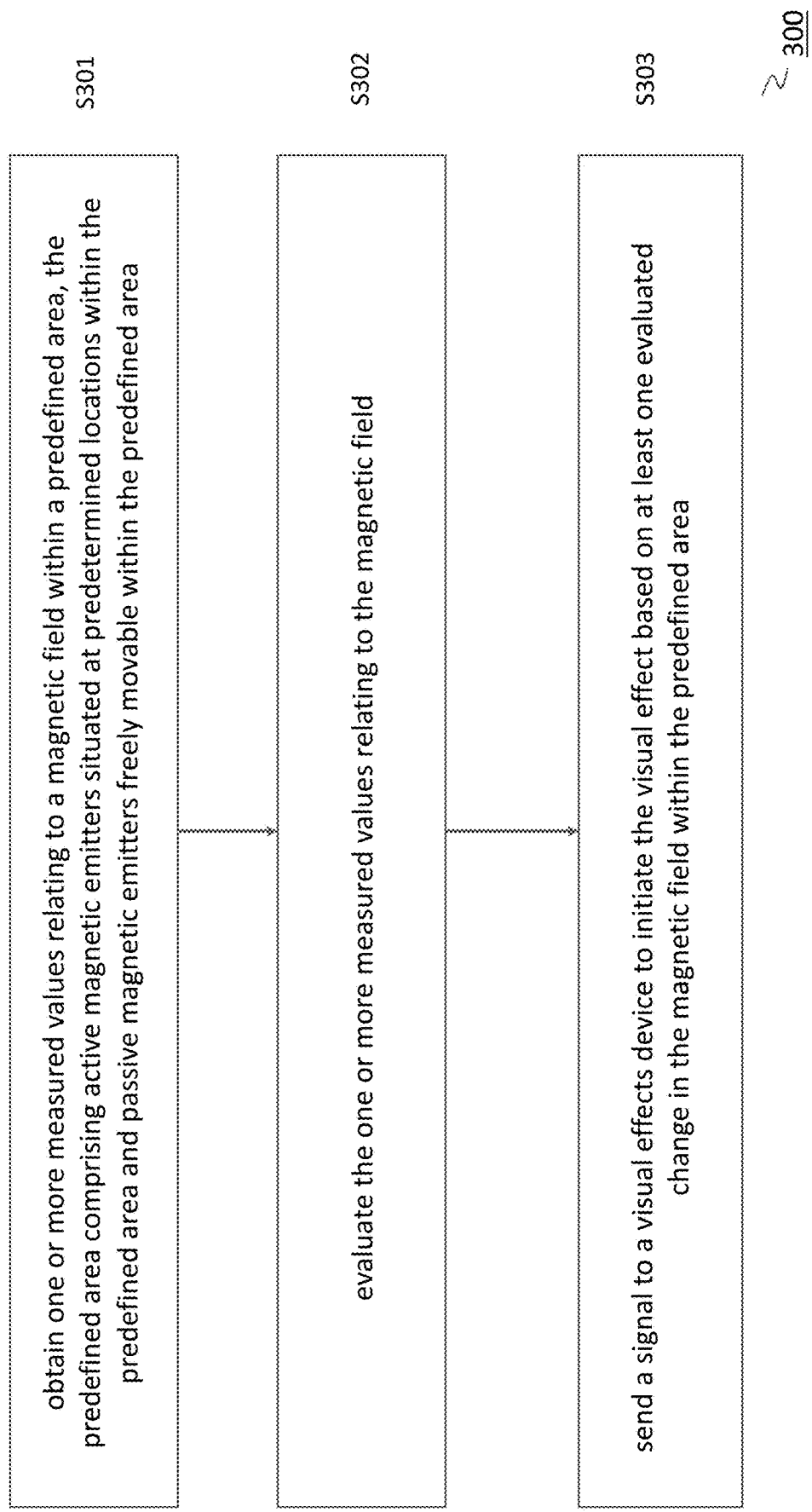
FIG. 3 illustrates a flow diagram of a method for initiating a visual effect according to embodiments.

FIG. 3 illustrates a flow diagram of a method for initiating a visual effect according to embodiments. In embodiments, method 300 shown may be implemented by a processing computer, such as processing computer 200 of FIG. 2 and/or processing computer 120 of system 100 shown in FIG. 1. Similarly, visual effects area(s), magnetic emitter(s), induced magnetic field(s), magnetic field measurement(s), and magnetic field detector(s)/sensor(s) mentioned in the description of method 300 may relate to corresponding components of system 100, as shown by FIG. 1.

Furthermore, the method may be a computer-implemented method, and processing instructions for performing the method may be a computer program product stored in a non-transitory computer-readable storage device, such as computer-readable medium 240 of processing computer 200, for example. As such, when executed on the processing computer 200, the computer program product may cause the processing computer to perform the method.

Looking at FIG. 3, in step S301, the processing computer obtains one or more measured values relating to a magnetic field within a predefined area (e.g., the visual effects area). In embodiments, the predefined area may comprise active magnetic emitter(s) situated at predetermined locations within the predefined area and passive magnetic emitter(s) freely movable within the predefined area. For example, the active magnetic emitter(s) may be actively powered magnetic emission devices positioned at stationary locations at, near, or around a visual effects area so that a measurable magnetic field may be induced. In addition, passive magnetic emitter(s) (e.g., Halbach arrays or other permanent magnet arrangement) may be integrated into, secured to, or otherwise coupled to a tracked subject or object moving within the visual effects area, thereby interacting with the induced magnetic field.

In step S302, the processing computer may evaluate the one or more measured values relating to the magnetic field. In embodiments, evaluating the one or more measured values relating to the magnetic field may comprise obtaining a heatmap of the magnetic field relative to a spatial mapping of a predefined area and updating the heat map of the magnetic field using the one or more measured values at a first time step. Furthermore, at step S302, the processing computer may perform the functions of comparing the updated heat map to a predictive model and predict, based on the comparison, a next update of the heat map for a second time step.

In step S303 the processing computer may send a signal to a visual effects device to initiate the visual effect based on at least one evaluated change in the magnetic field within the predefined area. In embodiments, at step S303, the processing computer may further perform the functions of comparing a predicted next update of the heatmap of the magnetic field for the second time step to a visual effects initiation criteria. Based on the comparison, the processing computer may send a signal to the visual effects device to initiate the visual effect at the second time step based on the comparison. As such, the fulfillment of visual effect initiation criteria may be anticipated for a second time step based on magnetic field measurements obtained at a first time step. Upon anticipating fulfillment of the visual effect initiation criteria, the signal to the visual effects device may be sent and the visual effect activated in the visual effects area.

Figure 4B:
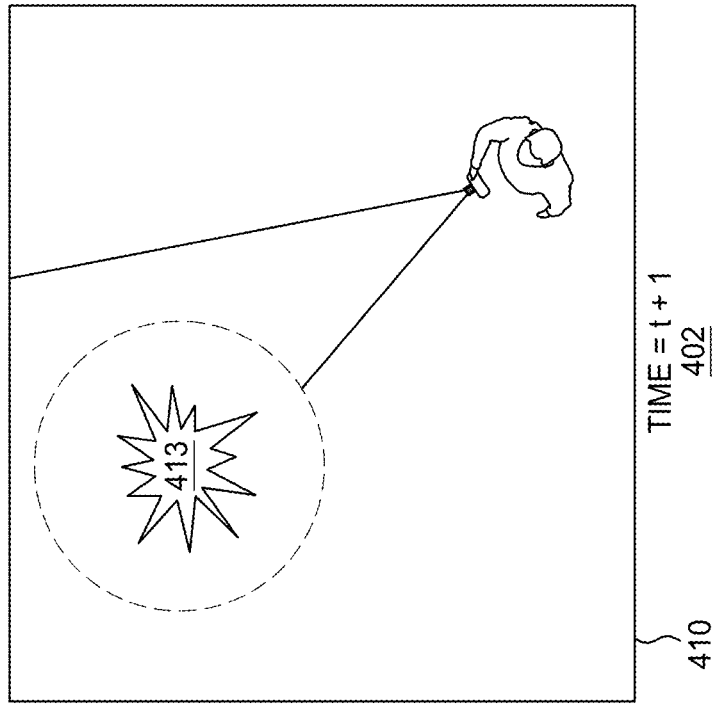
FIG. 4B illustrates the example of the area of FIG. 4A after the visual effects are triggered.
Figure 4A:
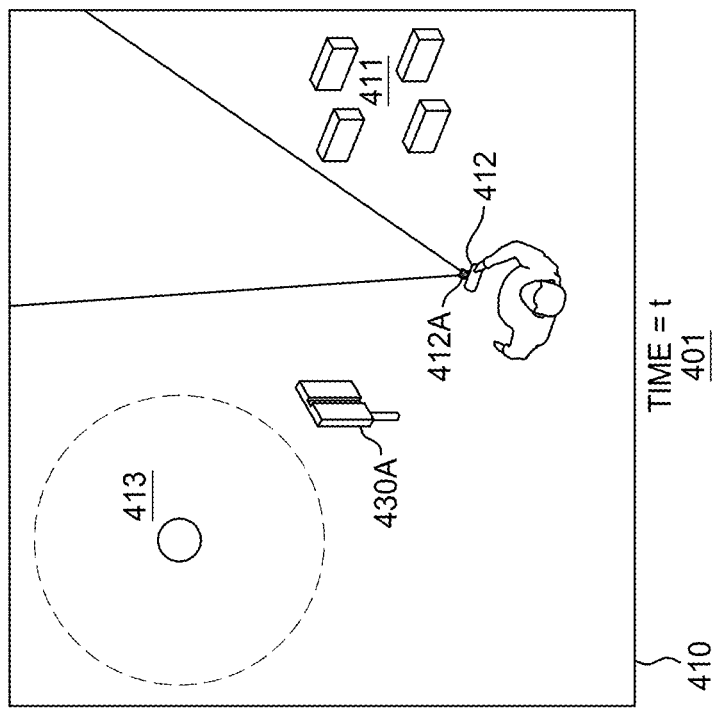
FIG. 4A illustrate an example of an area where visual effects can be triggered according to an embodiment.

FIG. 4A and FIG. 4B illustrate an example of an area where visual effects can be triggered according to an embodiment. As shown, a predefined visual effects area 410 is illustrated in two different time frames: time frame 401 (time=t) and time frame 402 (time=t+1). Visual effects area 410 is depicted as a film production set and the tracked object 412 is depicted as a camera. Embedded in or attached to the camera 412 may be a passive magnetic emitter 412A, such as a Halbach emitter. Looking at the time frame 401, a camera operator is holding camera 412 and pointing it at elements in the scene during a shot taking place in visual effects area 410. Also in the visual effects area 410, may be one or more active magnetic emitters 411 for inducing a magnetic field, and a magnetic sensor 430A that detects and obtains information about the induced magnetic field. As the camera operator moves around the visual effects area 410 and orients the camera 412 in different positions and directions, its pose affects the state of the induced magnetic field by way of the passive magnetic emitter 412A embedded therein/thereon. Thus, one or more measured values obtained using magnetic sensor 430A may provide information that can be correlated to the camera's pose and motion (e.g., by way of a processing computer). In time frame 401, the processing computer (not shown) may determine that the camera's motion is indicative of the camera achieving the desired pose for a visual effect in the next time step. For example, the processing computer 200 of FIG. 2 may generate a heat map and predict that the camera's viewing frustum will soon point at a portion of the visual effects area where a visual effect is localized. Therefore, the processing computer may send a signal to a visual effects device 413 to ramp up and initiate the visual effect in the time frame 402.

In the example of FIG. 4A, a plurality of active magnetic emitters 411 are illustrated in a clustered arrangement. However, in other examples in which a plurality of active magnetic emitters 411 are provided, the active magnetic emitters 411 may be positioned throughout the visual effects area 410, for example, in predetermined positions surrounding the passive magnetic emitter 412A, the visual effects device 413, or both of the passive magnetic emitter 412A and the visual effects device 413.

Figure 5B:
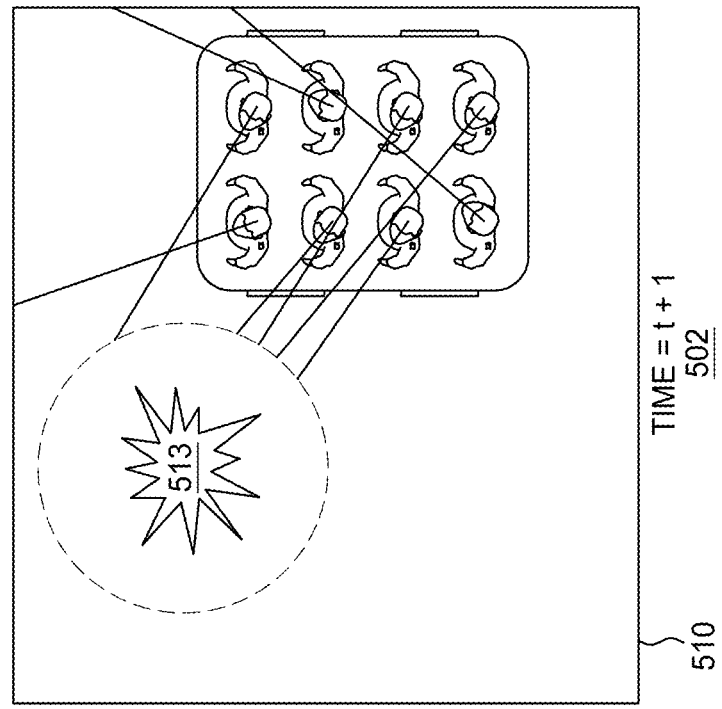
FIG. 5B illustrates the example of the area of FIG. 5A after the visual effects are triggered.
Figure 5A:
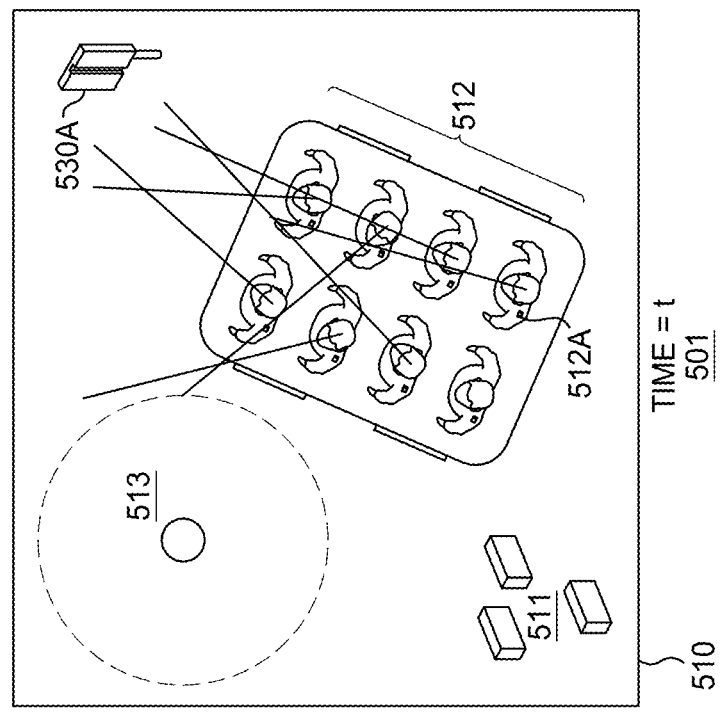
FIG. 5A illustrate an example of an area where visual effects can be triggered according to another embodiment.

FIG. 5A and FIG. 5B illustrate an example of an area where visual effects can be triggered according to another embodiment. As shown, a predefined visual affects area 510 is illustrated in two different time frames: time frame 501 (time=t) and time frame 502 (time=t+1). Visual effects area 510 is depicted as a theme park attraction, such as an amusement ride comprising a ride vehicle navigating through various show elements provided in the visual effects area 510. In the ride vehicle may be a plurality of riders/amusement park guests that serve as the tracked subjects in the system, each wearing a passive magnetic emitter 512A. For example, passive magnetic emitters 512A may be implemented as, or integrated into, hats or other headgear that can be worn.

Looking at the time frame 501, the guests 512 may be looking around at the different show elements in the scene as the ride vehicle passes through the visual effects area 510. Also in the visual effects area 510, may be one or more active magnetic emitters 511 for inducing a magnetic field, and a magnetic sensor 530A that detects and obtains information about the induced magnetic field. As the guests look in different directions, their head pose affects the state of the induced magnetic field by way of the passive magnetic emitters 512A. Thus, one or more measured values obtained using magnetic sensor 530A may provide information that can be correlated to the head pose and motion of the guests (e.g by way of a processing computer). In time frame 501, the processing computer (not shown) may determine that guest head motion is indicative of achieving the desired pose for a visual effect (i.e., the visual effects initiation criterion) in the next time step. For example, the processing computer 200 of FIG. 2 may generate a heat map and predict that the majority, or at least a predetermined number, of guests in the ride vehicle will soon look directly at a portion of the visual effects area where a visual effect is localized. Therefore, the processing computer may send a signal to a visual effects device 513 to ramp up and initiate the visual effect in the time frame 502.

In the example of FIG. 5A, a plurality of active magnetic emitters 511 are illustrated in a clustered arrangement. However, in other examples in which a plurality of active magnetic emitters 511 are provided, the active magnetic emitters 511 may be positioned throughout the visual effects area 510, for example, in predetermined positions surrounding the passive magnetic emitter 512A, the visual effects device 513, or both of the passive magnetic emitter 512A and the visual effects device 513.

The processes described herein may be implemented in a specialized processor. Such a processor will execute instructions, either at the assembly, compiled or machine-level, to perform the processes. Those instructions can be written by one of ordinary skill in the art following the description of the figures corresponding to the processes and stored or transmitted on a computer readable medium. The instructions may also be created using source code or any other known computer-aided design tool. A computer readable medium may be any medium, e.g., computer readable storage device, capable of carrying those instructions and include a CD-ROM, DVD, magnetic or other optical disc, tape, silicon memory (e.g., removable, non-removable, volatile or non-volatile), packetized or non-packetized data through wireline or wireless transmissions locally or remotely through a network. A computer is herein intended to include any device that has a specialized, general, multi-purpose, or single purpose processor as described above. For example, a computer may be a desktop computer, laptop, smartphone, tablet device, set top box, etc.

It is understood that the apparatuses, systems, computer program products, and processes described herein may also be applied in other types of apparatuses, systems, computer program products, and processes. Those skilled in the art will appreciate that the various adaptations and modifications of the aspects of the apparatuses, systems, computer program products, and processes described herein may be configured without departing from the scope and spirit of the present apparatuses, systems, computer program products, and processes. Therefore, it is to be understood that, within the scope of the appended claims, the present apparatuses, systems, computer program products, and processes may be practiced other than as specifically described herein.

What is claimed is:

1. A system for initiating a visual effect, the system comprising:
   one or more active magnetic emitters positioned within an area;
   one or more passive magnetic emitters configured to be movable within the area;
   a magnetic field detector configured to measure a strength and direction of a magnetic field within the area; and
   a processor in communication with the magnetic field detector,
   wherein the one or more passive magnetic emitters are configured to be integrated in coupled to, or secured to at least one tracked object or tracked subject within the area, and
   wherein the processor is configured to evaluate at least one change in the measured strength and direction of the magnetic field and to send a signal to a visual effect actuator or visual effects display to initiate the visual effect based on the at least one change.

2. The system of claim 1, wherein the visual effect comprises a lighting effect, a display of virtual content, or a pyrotechnic effect.

3. The system of claim 1, wherein the processor is further configured to:
   generate a heat map of the magnetic field relative to a spatial mapping of the area;
   generate at least one update of the heat map, the at least one update being generated using the measured strength and direction of the magnetic field taken during a previous time step;
   apply the at least one update to generate an updated heat map;
   compare the updated heat map to a predictive model stored in the processor; and
   predict, based on the comparison, at a current time step, a next update of the heat map for a subsequent time step.

4. The system of claim 3, wherein the processor is further configured to:
   compare the predicted next update of the heat map for the subsequent time step to a visual effects initiation criterion; and
   during the current time step, send the signal to the visual effect actuator or to the visual effects display to initiate the visual effect in response to the visual effects initiation criterion being satisfied such that the visual effect is executed at the subsequent time step.

5. The system of claim 4, wherein the visual effects initiation criterion comprises a predetermined position, orientation, or pose of the at least one tracked object or of the tracked subject in the area.

6. The system of claim 1, wherein the area is one or more of: a production set, live show set, or a gaming area.

7. The system of claim 1, wherein the tracked object comprises a camera, a prop, a costume, a wearable device, or a combination thereof.

8. The system of claim 1, wherein the one or more passive magnetic emitters comprise a Halbach array.

9. A method of initiating a visual effect, the method comprising:

positioning one or more active magnetic emitters within an area;

introducing one or more passive magnetic emitters into the area, the one or more passive magnetic emitters being movable within the area and configured to be integrated in, coupled to, or secured to at least one tracked object or tracked subject within the area;

obtaining one or more measurements relating to a strength and direction of a magnetic field within the area;

evaluating at least one change in the one or more measurements relating to the strength and direction of the magnetic field; and sending a signal to a visual effects device to initiate the visual effect based on at least one change in the one or more measurements relating to the magnetic field within the area.

10. The method of claim 9, further comprising:
generating a heat map of the magnetic field relative to a spatial mapping of the area.

11. The method of claim 10, further comprising:
generating at least one update of the heat map, the at least one update being generated using the one or more measurements relating to the strength and direction of the magnetic field taken during the previous time step; and applying the at least one update to generate an updated heat map.

12. The method of claim 11, further comprising:
comparing the updated heat map to a predictive model; and predicting, based on the comparison, at a current time step, a next update of the heat, map for a subsequent time step.

13. The method of claim 12, further comprising:
comparing the predicted next update of the heat map for the subsequent time step to a visual effects initiation criterion; and during the current time step, sending the signal to the visual effects device to initiate the visual effect in response to the visual effects initiation criterion being satisfied such that the visual effect is executed at the subsequent time step.

14. The method of claim 13, wherein the visual effects initiation criterion comprises a predetermined position, orientation, or pose of the at least one tracked object or of the tracked subject in the area.

15. The method f claim 9, wherein the one or more passive magnetic emitters comprise a Halbach array.

16. A computer program product comprising a nontransitory computer readable storage device having a computer readable program stored thereon, wherein the computer readable program when executed on a computer causes the computer to:

obtain one or more measurements relating to a strength and direction of a magnetic field within an area;

evaluate at least one change in the one or more measurements relating to the strength and direction of the magnetic field; and send a signal to a visual effects device to initiate the visual effect based on the at least one change, wherein one or more active magnetic emitters are positioned within the area, and wherein one or more passive magnetic emitters are movable within the area and configured to be integrated in, coupled to, or secured to at least one tracked object or tracked subject within the area.

17. The computer program product of claim 16, wherein the computer readable program when executed on the computer further causes the computer to:

generate a heat map of the magnetic field relative to a spatial mapping of the area;

generate at least one update of the heat map, the at least one update being generated using the measured strength and direction of the magnetic field taken during a previous time step;

apply the one or more updates to generate an updated heat map;

compare the updated heat map to a predictive model stored in a processor of the computer; and predict, based on the comparison, at a current time step, a next update of the heat map for a subsequent, time step.

18. The computer program product of claim 17, wherein the computer readable program when executed on the computer further causes the computer to:

compare the predicted next update of the heat map for the subsequent time step to a visual effects initiation criterion; and during the current time step, send the signal to the visual effects device to initiate the visual effect responsive to the visual effects initiation criterion being satisfied such that the visual effect is executed at the subsequent time step.

19. The computer program product of claim 18, wherein the visual effects initiation criterion comprises a predetermined position, orientation, or pose of the at least one tracked object or of the tracked subject in the area.

20. The computer program product of claim 16, wherein the one or passive magnetic emitters comprise a Halbach array.

* * * * *